US006462695B1

(12) United States Patent
Ahuja et al.

(10) Patent No.: US 6,462,695 B1
(45) Date of Patent: Oct. 8, 2002

(54) DYNAMIC BIASING TECHNIQUES FOR LOW POWER PIPELINE ANALOG TO DIGITAL CONVERTERS

(75) Inventors: Bhupendra Kumar Ahuja; Eric Glen Hoffman, both of Fremont, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/945,375

(22) Filed: Aug. 31, 2001

(51) Int. Cl.[7] .................................................. H03M 1/44
(52) U.S. Cl. ........................................ 341/161; 341/122
(58) Field of Search .............................. 341/122, 161, 341/162, 163; 327/94, 96

(56) References Cited

U.S. PATENT DOCUMENTS

| | | | | |
|---|---|---|---|---|
| 3,643,110 A | * | 2/1972 | Thompson | 307/238 |
| 4,287,441 A | | 9/1981 | Smith | |
| 5,039,880 A | * | 8/1991 | Astegher et al. | 307/353 |
| 5,180,932 A | * | 1/1993 | Bengel | 307/353 |
| 5,703,524 A | | 12/1997 | Chen | |
| 5,796,361 A | | 8/1998 | Levinson | |
| 6,018,269 A | | 1/2000 | Viswanathan | |
| 6,025,875 A | | 2/2000 | Vu et al. | |
| 6,340,044 B1 | * | 1/2002 | Chang et al. | 341/161 |

OTHER PUBLICATIONS

Mangelsdorf, C., et al., "A CMOS Front–End for CCD Cameras," 1996 IEEE International Solid–State Circuits Conference, pp. 190–191, 1996.

Abo, Andrew M., et al., "A 1.5–V, 10–bit, 14.3–MS/s CMOS Pipeline Analog–to–Digital Converter," IEEE Journal of Solid–State Circuits, vol. 34, No. 5, May 1999.

Nakamura, K., et al., "A CMOS Analog Front End Chip–Set for Mega Pixel Camcorders," 2000 IEEE International Solid–State Circuits Conference, pp. 190–191, 2000.

Kasha, Dan B. et al., "A 16–mW, 120–dB Linear Switched–Capacitor Delta–Sigma Modulator with Dynamic Biasing," IEEE Journal of Solid–State Circuits, vol. 34, No. 7, pp. 921–925, Jul. 1999.

Lewis, Stephen H., "Optimizing the Stage Resolution in Pipelined, Multistage, Analog–to–Digital Converters for Video–Rate Applications," IEEE Transactions on Circuits and Systems–II: Analog and Digital Signal Processing, vol. 39, No. 8, pp. 516–523, Aug. 1992.

* cited by examiner

Primary Examiner—Howard L. Williams
(74) Attorney, Agent, or Firm—Townsend and Townsend and Crew LLP

(57) ABSTRACT

A method and circuitry for implementing low-power analog-to-digital converters. More particularly, embodiments of the present invention provide an amplifier circuit for pipeline ADCs having multiple stages, some in sample mode, some in hold mode. The stages include residue amplifiers which include a pre-amp and a current source. The current source is turned off during the sample mode. Some embodiments include a second current source that provides a bleeder current during the sample phase so that the pre-amp remains in steady state.

13 Claims, 3 Drawing Sheets

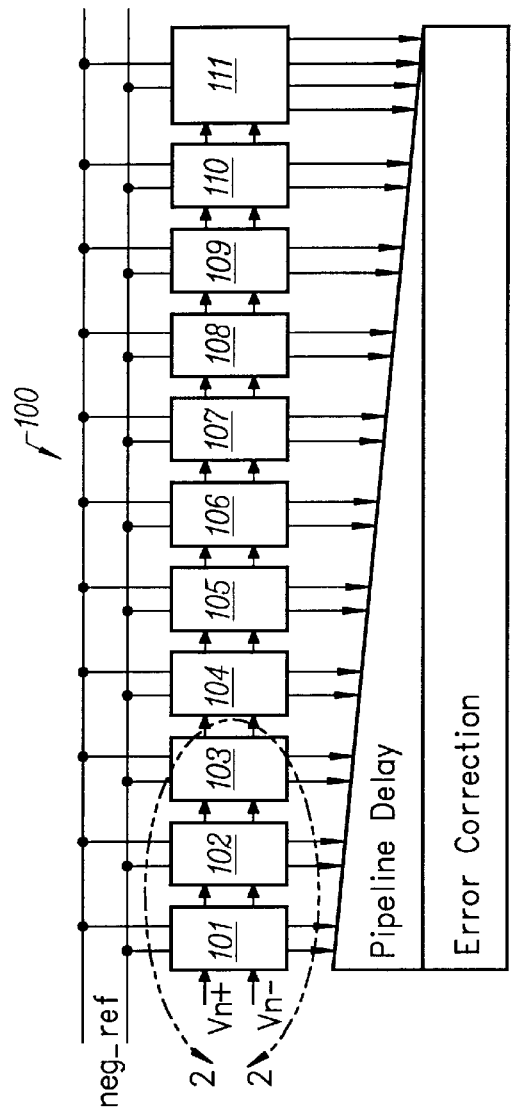
FIG. 1
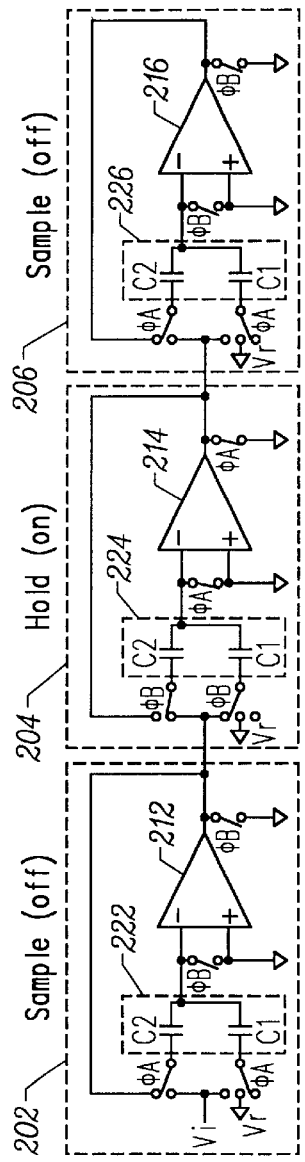
FIG. 2
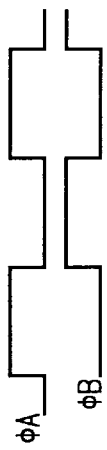

DYNAMIC BIASING TECHNIQUES FOR LOW POWER PIPELINE ANALOG TO DIGITAL CONVERTERS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention relates generally to integrated circuits. More particularly, embodiments of the invention relate to a method and circuitry for implementing low-power pipeline analog-to-digital converter circuits.

Pipeline analog-to-digital converters (ADC) are used in high-performance operations, such as in high-speed, high-resolution data acquisition systems.

An ADC can have many residue amplifiers. Most of the power dissipation of an ADC occurs in the residue amplifiers. Such amplifiers are typically class-A type op-amps and thus dissipate significant power. Because one of the primary goals of many ADC circuits is to achieve high-speed, many ADCs are not designed for low-power dissipation. However, the growing use of ADCs in battery powered systems requires the minimization of power dissipation.

"A 16-mW, 120-dB Linear Switched-Capacitor Delta-Sigma Modulator with Dynamic Biasing," by Dan B. Kasha, Wai L. Lee, and Axel Thomsen describes a dynamic biasing technique. However, this biasing technique is not used in a pipeline ADC but rather is used in a different type of ADC circuit which is a fourth-order delta-sigma ($\Delta\Sigma$) ADC. The problem with this design is that its biasing circuit requires many elements. If applied to a pipeline ADC, the power consumed by the total number of elements of the biasing circuit will be multiplied by the number of stages in the pipeline ADC. As a result, low-power dissipation would not be achieved.

Thus, there is a need for a new amplifier circuit for pipeline ADC circuits. The circuit should achieve low-power dissipation.

BRIEF SUMMARY OF THE INVENTION

The present invention achieves the above need with a method and circuitry for implementing an ADC. More particularly, embodiments of the present invention provide dynamic biasing methods and circuitry that achieves a low-power pipeline ADC.

Embodiments of the present invention provide an amplifier circuit for pipeline ADCs having multiple stages. In an N-bit ADC system, there will be (N–2) stages of pipeline formed by residue amplifiers and one final 2-bit flash converter stage. In one embodiment of the present invention, specifically for a 12-bit ADC, there are 10 residue amplifier based stages and one final 2-bit flash converter stage, as shown in FIG. 1. The pipeline ADC system makes use of $\phi_A$ and $\phi_B$ clocks shown in FIG. 2, both having a 50% duty cycle to operate these stages. Each stage performs a sample function for one-half the clock period and later performs a residue amplification and hold function for the other half of the clock period. At any given time, half of the pipeline stages are in sample mode and other half of pipeline stages are in hold mode, in alternating manner. The stages include residue amplifiers which include a pre-amp and a class-A type output stage which uses a current source. Most of the residue amplifier power is expended in the output stage due to the current source. The current source is turned off during the sample mode. Some embodiments include a second current source that provides a bleeder current during the sample phase so that the pre-amp remains in steady state.

In one embodiment of the present invention provide a gain stage configured to receive and digitize a signal, and to amplify and output a residue with a gain. Also included is an output stage coupled to the gain stage and configured to bias the gain stage. The output stage includes a current source and a driver transistor. The current source is on during a hold mode and off during a sample mode whereby the overall power dissipation of the output stage is reduced.

This reduction in power can occur in all residual amplifiers of a pipeline ADC to which the invention is applied. Because at least one half of all the residual amplifiers in the pipeline ADC will be in sample mode at any given time, significantly less power is dissipated in the overall system.

In one embodiment, the amplifier circuit includes a second current source. The second current source is configured to bias the gain stage during both the hold mode and the sample mode so that the gain stage remains in steady state during the hold and sample modes.

In another embodiment, the current source has a bias transistor with a gate coupled to a switch. The switch turns the bias transistor on during the hold mode and off during the sample mode. Accordingly, the current source turns on during the hold mode and off during the sample mode.

In another embodiment, the current source is controlled by a master bias controller.

Embodiments of the present invention achieve their purposes and benefits in the context of known circuit and process technology and known techniques in the electronic and process arts. Further understanding, however, of the nature, objects, features, and advantages of the present invention is realized by reference to the latter portions of the specification, accompanying drawings, and appended claims. Other objects, features, and advantages of the present invention will become apparent upon consideration of the following detailed description, accompanying drawings, and appended claims.

BRIEF DESCRIPTION OF THE DRAWINGS

FIG. 1 shows a simplified high-level block diagram of a pipeline analog-to-digital converter (ADC), according to the prior art;

FIG. 2 shows a simplified high-level schematic diagram of three residual amplifiers, according to the prior art;

DETAILED DESCRIPTION OF THE INVENTION

FIG. 1 shows a simplified high-level block diagram of a pipeline analog-to-digital converter (ADC) 100, according to the prior art. Pipeline ADC 100 includes residue amplifiers, or "stages," 101–110 and a flash converter 111. Pipeline ADC 100 has two modes of operation, a sample mode and a hold mode. During operation, successive stages alternate between the two modes, in sync with a two-phase non-overlapping clock (not shown). Pipeline ADCs are well-known in the art.

FIG. 2 shows a simplified high-level schematic diagram of three residual amplifiers 202, 204 and 206, according to the prior art. Each of residual amplifiers 202, 204 and 206 are used in one of the digitizing stages of the ADC, in addition to digitizing circuitry, to amplify remainders. Residue amplifiers 202, 204 and 206 include class-A type operational-amplifiers (op-amps) 212, 214 and 216, respectively, and capacitor networks 222, 224 and 226, respectively. Residue amplifiers typically use class-A type op-amps, because such op-amps have constant bias currents in their output stages.

In operation, while every other stage is in sample mode, the remaining stages are in hold mode. When a stage is in sample mode, it samples the output of the previous stage on its capacitor network. When a stage is in hold mode, it creates a residue with a gain. Residue amplifiers and class-A op-amps are well-known in the art.

Figure 3:
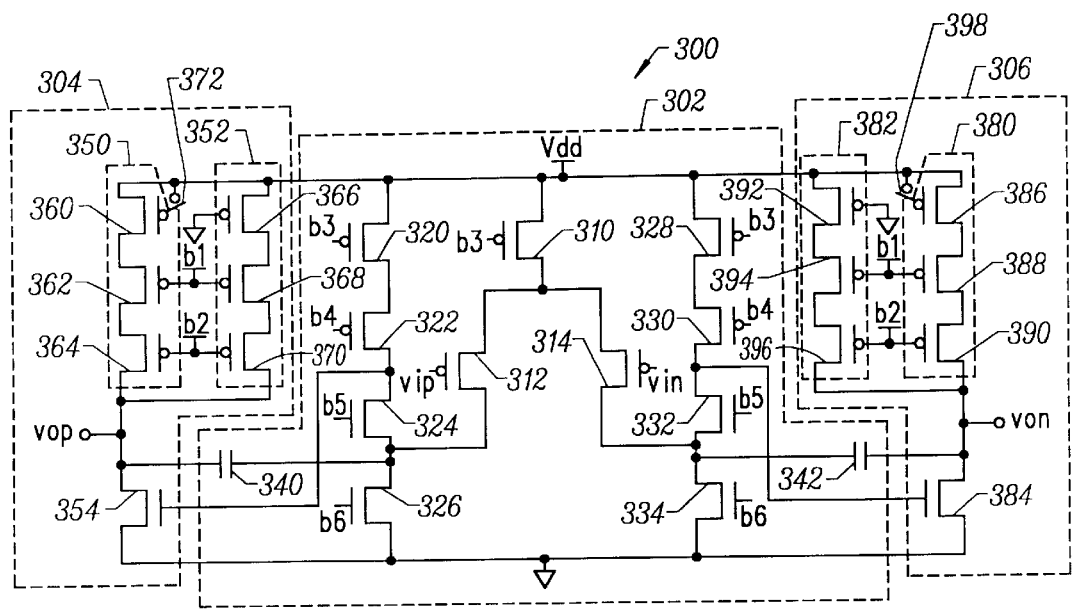
FIG. 3 shows a simplified high-level schematic diagram of a 2-stage amplifier, according to an embodiment of the present invention.

FIG. 3 shows a simplified high-level schematic diagram of a 2-stage amplifier 300, according to an embodiment of the present invention. Amplifier 300 and other embodiments of the present invention can be used to implement pipeline ADC 100 of FIG. 1. Residue amplifier 300 includes a gain stage, or "pre-amp," 302 and two output stages 304 and 306.

In this specific embodiment, pre-amp 302 is a folded-cascode differential amplifier which includes gain transistors 310, 312 and 314, bias transistors 320, 322, 324, 326, 328, 330, 332 and 334, and capacitors 340 and 342 for Miller compensation. Folded-cascode differential amplifiers are well-known in the art. The specific type of pre-amp used will depend on the specific application.

Output stage 304 includes a current source 350, a current source 352, and a driver transistor 354. Current source 350 includes transistors 360, 362 and 364, and current source 353 includes transistors 366, 368 and 370. Each current source can have more or fewer transistors. The exact number of transistors per current source will depend on the specific application. Output stage 304 also includes a switch 372. In this specific embodiment, switch 372 couples to current source 350 and specifically to the gate of transistor 360.

Output stage 306 is configured similarly to output stage 304. Output 306 includes a current source 380, a current source 382, and a driver transistor 384. Current source 380 includes transistors 386, 388 and 390, and current source 382 includes transistors 392, 394 and 396. Each current source can have more or fewer transistors. The exact number of transistors per current source will depend on the specific application. Output stage 306 also includes a switch 398. In this specific embodiment, switch 398 couples to current source 380 and specifically to the gate of transistor 386.

In operation, when amplifier 300 is in sample mode, it samples the output of a previous stage (not shown) on a capacitor network (not shown). When amplifier 300 is in hold mode, it creates a residue with a gain. In effect, amplifier 300 functions like a full amplifier in the hold mode only.

With regard to power dissipation, when a given stage is in hold mode, that stage is driven by the previous stage. When a given stage is in the sample mode, less power is required because the sampling is done passively using only its capacitor feedback network. In effect, only half of the residue amplifiers within a pipeline ADC are needed at any single point of time. Accordingly, in sample mode, the power of amplifier 300 can be significantly reduced by turning off some bias current. This can save significant power of an entire ADC.

For example, suppose applying amplifier 300 were applied to a 12-bit ADC with 10 residue amp stages and a flash converter, where each residue amplifier outputs a residue with a gain of two. Assume that for each residue amplifier, $P_{individual}$=3.3 V×3 mA=10 mW. Thus, the total power consumed would be 100 mW, or $P_{total}$=10×10 mW=100 mW. According to the present invention, if the power of five residue amplifiers (5 alternate stages) were reduced to 2 mW, for example, during sample mode, $P_{total}$= 5×10 mW+5×2 mW=60 mW. This would result in an overall power savings of 40%. This result could be made by dynamically by turning the power of these stages off and on.

While at first glance it might appear that the stages could be completely powered down in sample mode, the time that it would take the pre-amp to return to steady state would reduce the available settling time and introduce errors in the residue being passed to the next stage. Accordingly, stages in sample mode can be completely powered down in some embodiments. Other embodiments can include a small "bleeder" current that remains in sample mode to keep the pre-amps in steady state. In yet other embodiments, such as the specific embodiment of FIG. 3, two current sources per output stage can used where both current sources are on during hold mode and only one is turned off during sample mode so that the pre-amp remains in steady state.

Still referring to FIG. 3, the following discussion details the operation of output stage 304. In this specific embodiment, pre-amp 302 is fully differential and output stages 304 and 306 are identical dynamic bias circuits and they operate identically. Also, switch 372 of output stage 304 and switch 398 of output stage 306 operate on the same clock phase.

Referring to output stage 304, during hold mode, current sources 350 and 352 are on during hold mode to provide full bias currents in output stage 304. The sum of the currents supplied by sources 350 and 352 is sufficient to drive the load of the subsequent stages in hold mode. During the sample mode, current source 350 is turned off via switch 372. The switch 372 and 398 are controlled by the pipeline ADC clock during the sample mode operation of the pipeline stage. Since every alternate stage goes into sample mode at the same time, this controlled clock signal is common for all even numbered pipeline stages and a separate controlled clock signal is common for all odd numbered pipeline stages.

In this specific embodiment, the transistors of the current sources are PMOS transistors. Switch 372 ties the gate of transistor 360 to $V_{dd}$ thus turning it and current source 350 off. Current source 352 is designed such that it supplies just enough current, so-called "bleeder" current, to properly null the amplifier, thus preparing it for use in the hold mode. The amount of current required to do this is determined by capacitor loads (not shown) at outputs $V_{op}$ and $V_{on}$. As the subsequent stage has switched its capacitors away from the previous stage's output, the bias requirements at that time are minimal. Upon switching into hold mode, switch 372 connects the gate of transistor 360 to ground. This reactivates the current source 350 and increases the output stage bias to an appropriate drive strength. The two current sources on together provide the total needed current, so the one turned off is smaller than it would be if a single current source were used. Experimental results have shown that about 75% of the output stage current may be saved during the sample mode without degrading the performance of the ADC. This savings results in significant overall power savings for an ADC.

It is to be understood that the implementation of FIG. 3 is merely an example and should not limit the scope of the claims herein. In light of the present invention, one of ordinary skill in the art would recognize many other variations, modifications, and alternatives. Also, the described circuit and method can be implemented in a multitude of different forms (i.e., software, hardware, or a combination of both) in a variety of systems.

For example, in some embodiments, the present invention is applied to CMOS fully differential class-A type amplifiers. However, in other embodiments, the present invention can be applied to other types of circuits. For example, it can also be applied to BiCMOS or bipolar op-amps which are fully differential. It can also be applied to single-ended type amplifiers operating in Class A or AB modes, for example.

Figure 4:
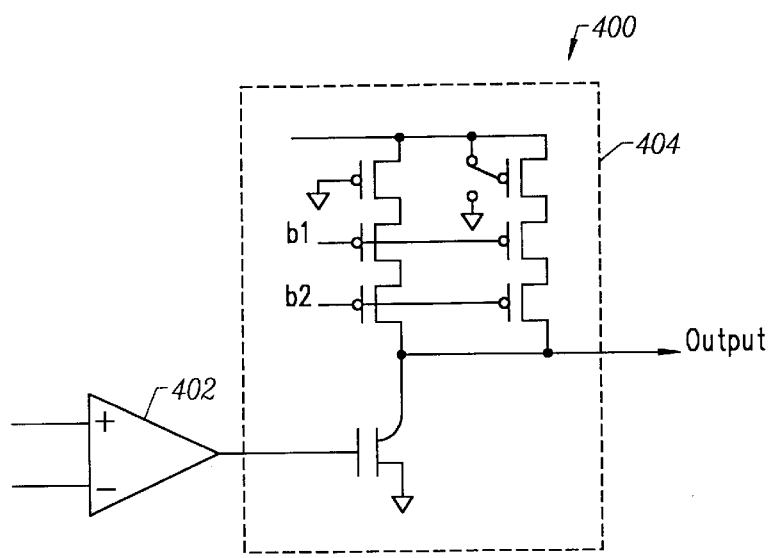
FIG. 4 shows a simplified high-level schematic diagram of a single-ended amplifier, according to an embodiment of the present invention.

FIG. 4 shows a simplified high-level schematic diagram of a single-ended amplifier 400, according to an embodiment of the present invention. Amplifier 400 includes a gain stage 402 and an output stage 404. Gain stage 402 operates similarly to gain stage 302 of FIG. 3. Output stage 404 operates similarly to output stage 304 of FIG. 3.

Figure 5:
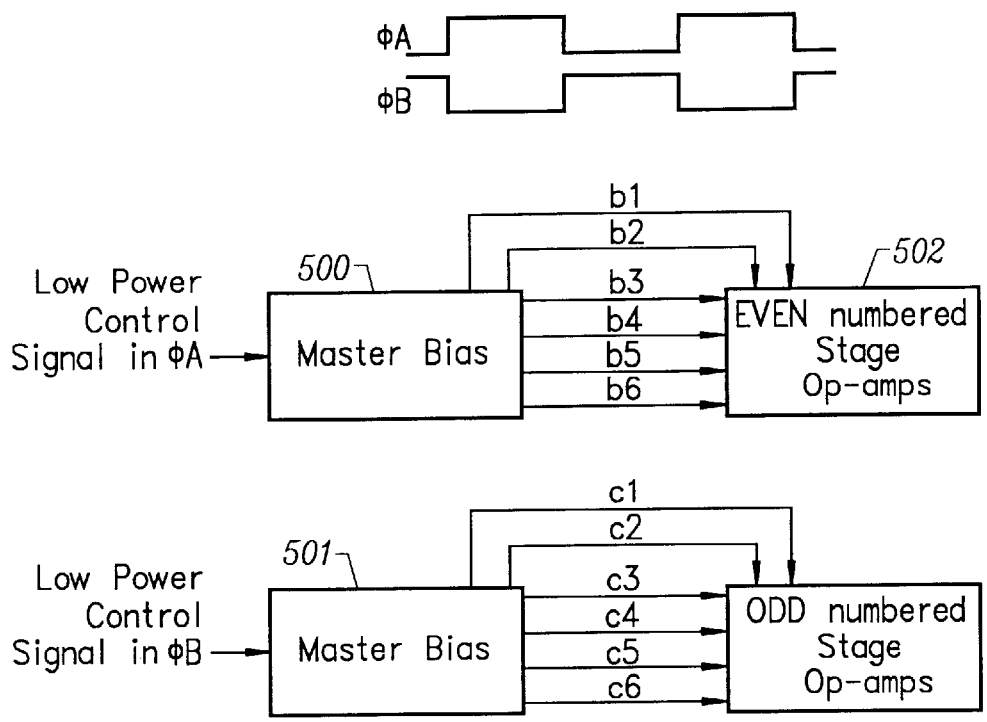
FIG. 5 shows a simplified high-level block diagram of a master bias controller.
Figure 6:
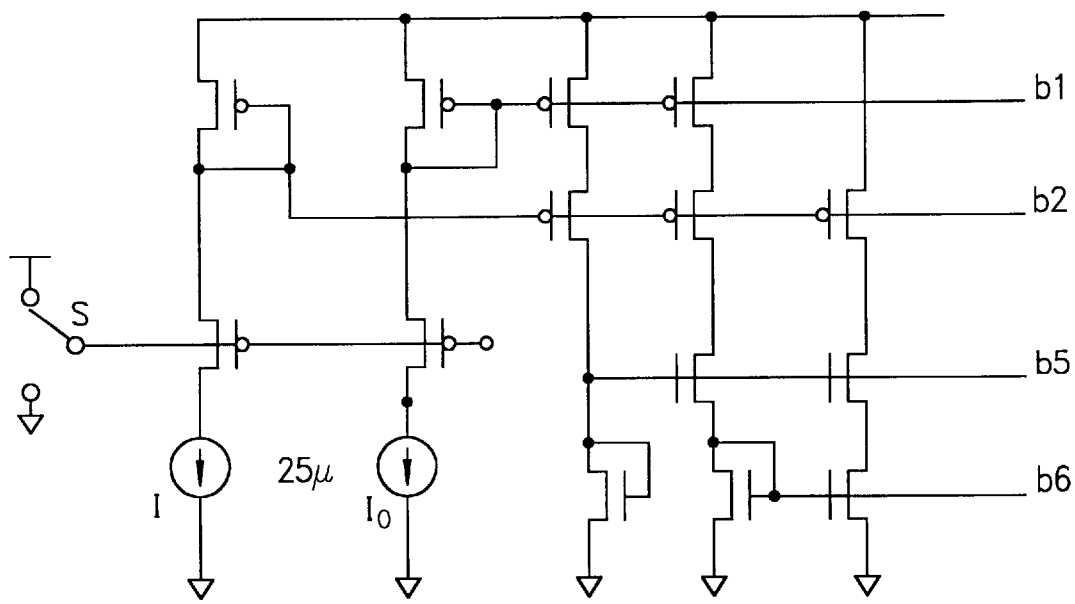
FIG. 6 shows a simplified high-level schematic diagram of one implementation of the master bias controller of FIG. 5.

FIG. 5 shows a simplified high-level block diagram of a master bias controller 500 which dynamically biases all even-numbered pipeline-stage residue amplifiers are represented as 502 of the present invention during $\phi_A$. A similar master bias controller 501 can be used to control all odd-numbered pipeline-stage residue amplifiers 503 in $\phi_B$ also shown in FIG. 5. Master bias controllers 500 and 501 control bias currents inside the pre-amp by providing gate bias voltages labeled b1 through b6 and c1 through c6. These gate biases determine specific current levels in the pre-amp and output stages of the op-amps. The Master bias controller can be designed to provide two different sets of bias voltages appearing at b1 through b6 or c1 through c6, resulting in nominal required current value for the hold mode or a small bleeder current value in sample mode in the op-amps during $\phi_A$ or $\phi_B$. One such master bias controller is shown in FIG. 6. Controlling a single switch, labeled S, in $\phi_A$ or $\phi_B$, one can provide bias voltages at b1 through b6 such that the op-amps get nominal currents for hold mode and zero bleeder current for sample mode.

FIG. 6 shows a simplified high-level schematic diagram of one implementation of the master bias controller of FIG. 5. Alternative circuit implementations exist for the same functionality.

Conclusion

In conclusion, it can be seen that embodiments of the present invention provide numerous advantages. Principally, they reduce power dissipation of pipeline ADCs by reducing the power of the output stages of residue amplifiers during sample mode. Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. An amplifier circuit for pipeline analog-to-digital converters, the circuit comprising:

a stage comprising a residue amplifier;

a current source in the residue amplifier; and a control circuit for reducing the current provided by the current source during a sample phase.

2. The circuit of claim 1 wherein the current source is not turned off but only partially reduced.

3. The circuit of claim 1 further comprising a second current source that provides a bleeder current during the sample phase.

4. The circuit of claim 1 further comprising:

a gain stage configured to receive a signal, and to amplify and output a residue with a gain; and a first output stage coupled to the gain stage and configured to bias the gain stage, the first output stage comprising a first current source and a first driver transistor, the first current source being on during a hold mode and off during a sample mode whereby the overall power dissipation of the output stage is reduced.

5. The circuit of claim 4 wherein the first output stage further comprises a second current source, the second current source being configured to bias the gain stage during both the hold and sample modes whereby the gain stage remains in steady state during the hold and sample modes.

6. The circuit of claim 4 wherein the first current source comprises a first bias transistor having a gate coupled to a first switch, the first switch turning on the first bias transistor during the hold mode and off during the sample mode.

7. The circuit of claim 4 further comprising a second output stage coupled to the gain stage and configured to bias the gain stage, the second output stage comprising a third current source and a second driver transistor, the third current source being on during a hold mode and off during a sample mode whereby the overall power dissipation of the output stage is reduced.

8. The circuit of claim 4 further comprising a master bias controller configured to control the bias currents inside the amplifier circuit.

9. The circuit of claim 7 wherein the second output stage further comprises a fourth current source, the fourth current source being configured to bias the gain stage during both the hold and sample modes whereby the gain stage remains in steady state during the hold and sample modes.

10. The circuit of claim 7 wherein the third current source comprises a second bias transistor having a gate coupled to a second switch, the second switch turning on the second bias transistor during the hold mode and off during the sample mode.

11. An amplifier circuit for pipeline analog-to-digital converters, the circuit comprising:

a gain stage configured to receive a signal, and to amplify and output a residue with a gain;

a first output stage coupled to the gain stage and configured to bias the gain stage, the first output stage comprising:
  a first current source comprising a first bias transistor having a gate coupled to a first switch, the first switch turning on the first bias transistor during the hold mode and off during the sample mode, the first current source being on during the hold mode and off during the sample mode whereby the overall power dissipation of the output stage is reduced;
  second current source, the second current source being configured to bias the gain stage during both the hold and sample modes whereby the gain stage remains in steady state during the hold and sample modes; and
  a first driver transistor coupled to the first and second current sources;
a second output stage coupled to the gain stage and configured to bias the gain stage, the second output stage comprising:
  a third current source comprising a second bias transistor having a gate coupled to a second switch, the second switch turning on the second bias transistor during the hold mode and off during the sample mode, the third current source being on during a hold mode and off during a sample mode whereby the overall power dissipation of the output stage is reduced; and
  a fourth current source, the fourth current source being configured to bias the gain stage during both the hold and sample modes whereby the gain stage remains in steady state during the hold and sample modes; and
  a second driver transistor coupled to the third and fourth current sources; and
a master bias controller configured to the bias currents inside the amplifier circuit.

12. In a pipeline analog-to-digital converter with multiple stages, each stage having a residue amplifier, a method comprising:
  sampling a stage during a first phase;
  holding a stage during a second phase; and
  reducing current provided to a residue amplifier in the stage during the first phase.

13. The method of claim 12 further comprising providing a bleeder current during the first phase so that a pre-amp in the residue amplifier remains in steady state.

* * * * *